United States Patent [19]

Servel

[11] 4,334,304

[45] Jun. 8, 1982

[54] TIME DIVISION MULTIPLEX SWITCHING NETWORK WITH AN ASSOCIATIVE BUFFER STORE OF THE REGISTER COUNTER TYPE

[76] Inventor: Michel J. Servel, Le Rhu en Servel, Lannion, France, 22300

[21] Appl. No.: 148,007

[22] Filed: May 8, 1980

[30] Foreign Application Priority Data

May 11, 1979 [FR] France .................................. 79 12080

[51] Int. Cl.³ .............................................. H04J 3/00
[52] U.S. Cl. ........................................................ 370/66
[58] Field of Search .................................. 370/66, 68

[56] References Cited

U.S. PATENT DOCUMENTS 3,930,125 12/1975 Picandet ................................ 370/66
3,971,892 4/1976 Schlicte ................................ 370/86
4,154,986 5/1979 Howells et al. ........................ 370/68

Primary Examiner—Joseph A. Orsino, Jr.
Attorney, Agent, or Firm—Lowe, King, Price & Becker

[57] ABSTRACT

A time division multiplex switching network comprises a data word circulating store and a random address circulating store. These two circulating stores are synchronous and have data word registers and random address registers respectively associated two by two. The bytes in the time-slots of an incoming supermultiplex highway are written in the data word registers and addresses depending on the outgoing time slots which are to be connected are written in the random address registers. These addresses are incremented at each step of the random address circulating store. When the incremented address reaches a predetermined value, a data word is read in the data word circulating store.

3 Claims, 9 Drawing Figures

TABLE V (FIG. 7)

| | A9 | A8 | A7 | A6 | A5 | A4 | A3 | A2 | A1 | A0 |
|---|---|---|---|---|---|---|---|---|---|---|
| → R9,947 | $A_{9,947}$ / $R_{8,948}$ | $A_{8,948}$ / $R_{7,949}$ | $A_{7,949}$ / $R_{6,950}$ | $A_{6,950}$ / $R_{5,951}$ | $A_{5,951}$ / $R_{4,952}$ | $A_{4,952}$ / $R_{3,953}$ | $A_{3,953}$ / $R_{2,954}$ | $A_{2,954}$ / $R_{1,955}$ | $A_{1,955}$ / $R_{0,956}$ | $A_{0,956}$ / 1 |
| R9,948 | $A_{9,948}$ / $R_{8,949}$ | $A_{8,949}$ / $R_{7,950}$ | $A_{7,950}$ / $R_{6,951}$ | $A_{6,951}$ / $R_{5,952}$ | $A_{5,952}$ / $R_{4,953}$ | $A_{4,953}$ / $R_{3,954}$ | $A_{3,954}$ / $R_{2,955}$ | $A_{2,955}$ / $R_{1,956}$ | $A_{1,956}$ / $R_{0,957}$ | $A_{0,957}$ / 1 |
| R9,949 | $A_{9,949}$ / $R_{8,950}$ | $A_{8,950}$ / $R_{7,951}$ | $A_{7,951}$ / $R_{6,952}$ | $A_{6,952}$ / $R_{5,953}$ | $A_{5,953}$ / $R_{4,954}$ | $A_{4,954}$ / $R_{3,955}$ | $A_{3,955}$ / $R_{2,956}$ | $A_{2,956}$ / $R_{1,957}$ | $A_{1,957}$ / $R_{0,958}$ | $A_{0,958}$ / 1 |
| R9,950 | $A_{9,950}$ / $R_{8,951}$ | $A_{8,951}$ / $R_{7,952}$ | $A_{7,952}$ / $R_{6,953}$ | $A_{6,953}$ / $R_{5,954}$ | $A_{5,954}$ / $R_{4,955}$ | $A_{4,955}$ / $R_{3,956}$ | $A_{3,956}$ / $R_{2,957}$ | $A_{2,957}$ / $R_{1,958}$ | $A_{1,958}$ / $R_{0,959}$ | $A_{0,959}$ / 1 |
| R9,951 | $A_{9,951}$ / $R_{8,952}$ | $A_{8,952}$ / $R_{7,953}$ | $A_{7,953}$ / $R_{6,954}$ | $A_{6,954}$ / $R_{5,955}$ | $A_{5,955}$ / $R_{4,956}$ | $A_{4,956}$ / $R_{3,957}$ | $A_{3,957}$ / $R_{2,958}$ | $A_{2,958}$ / $R_{1,959}$ | $A_{1,959}$ / $R_{0,960}$ | $A_{0,960}$ / 1 |
| R9,952 | $A_{9,952}$ / $R_{8,953}$ | $A_{8,953}$ / $R_{7,954}$ | $A_{7,954}$ / $R_{6,955}$ | $A_{6,955}$ / $R_{5,956}$ | $A_{5,956}$ / $R_{4,957}$ | $A_{4,957}$ / $R_{3,958}$ | $A_{3,958}$ / $R_{2,959}$ | $A_{2,959}$ / $R_{1,960}$ | $A_{1,960}$ / $R_{0,961}$ | $A_{0,961}$ / 1 |
| R9,953 | $A_{9,953}$ / $R_{8,954}$ | $A_{8,954}$ / $R_{7,955}$ | $A_{7,955}$ / $R_{6,956}$ | $A_{6,956}$ / $R_{5,957}$ | $A_{5,957}$ / $R_{4,958}$ | $A_{4,958}$ / $R_{3,959}$ | $A_{3,959}$ / $R_{2,960}$ | $A_{2,960}$ / $R_{1,961}$ | $A_{1,961}$ / $R_{0,962}$ | $A_{0,962}$ / 1 |
| R9,954 | $A_{9,954}$ / $R_{8,955}$ | $A_{8,955}$ / $R_{7,956}$ | $A_{7,956}$ / $R_{6,957}$ | $A_{6,957}$ / $R_{5,958}$ | $A_{5,958}$ / $R_{4,959}$ | $A_{4,959}$ / $R_{3,960}$ | $A_{3,960}$ / $R_{2,961}$ | $A_{2,961}$ / $R_{1,962}$ | $A_{1,962}$ / $R_{0,963}$ | $A_{0,963}$ / 1 |
| R9,955 | $A_{9,955}$ / $R_{8,956}$ | $A_{8,956}$ / $R_{7,957}$ | $A_{7,957}$ / $R_{6,958}$ | $A_{6,958}$ / $R_{5,959}$ | $A_{5,959}$ / $R_{4,960}$ | $A_{4,960}$ / $R_{3,961}$ | $A_{3,961}$ / $R_{2,962}$ | $A_{2,962}$ / $R_{1,963}$ | $A_{1,963}$ / $R_{0,964}$ | $A_{0,964}$ / 1 |
| R9,956 | $A_{9,956}$ / $R_{8,957}$ | $A_{8,957}$ / $R_{7,958}$ | $A_{7,958}$ / $R_{6,959}$ | $A_{6,959}$ / $R_{5,960}$ | $A_{5,960}$ / $R_{4,961}$ | $A_{4,961}$ / $R_{3,962}$ | $A_{3,962}$ / $R_{2,963}$ | $A_{2,963}$ / $R_{1,964}$ | $A_{1,964}$ / $R_{0,965}$ | $A_{0,965}$ / 1 |
| R9,957 | $A_{9,957}$ / $R_{8,958}$ | $A_{8,958}$ / $R_{7,959}$ | $A_{7,959}$ / $R_{6,960}$ | $A_{6,960}$ / $R_{5,961}$ | $A_{5,961}$ / $R_{4,962}$ | $A_{4,962}$ / $R_{3,963}$ | $A_{3,963}$ / $R_{2,964}$ | $A_{2,964}$ / $R_{1,965}$ | $A_{1,965}$ / $R_{0,966}$ | $A_{0,966}$ / 1 |
| R9,958 → | $A_{9,958}$ / $R_{8,959}$ | $A_{8,959}$ / $R_{7,960}$ | $A_{7,960}$ / $R_{6,961}$ | $A_{6,961}$ / $R_{5,962}$ | $A_{5,962}$ / $R_{4,963}$ | $A_{4,963}$ / $R_{3,964}$ | $A_{3,964}$ / $R_{2,965}$ | $A_{2,965}$ / $R_{1,966}$ | $A_{1,966}$ / $R_{0,967}$ | $A_{0,967}$ / 1 |

TABLE VI (FIG. 8)

| | $A_9,947$ $R_8,948$ | $A_8,948$ $R_7,949$ | $A_7,949$ $R_6,950$ | $A_6,950$ $R_5,951$ | $A_5,951$ $R_4,952$ | $A_4,952$ $R_3,953$ | $A_3,953$ $R_2,954$ | $A_2,954$ $R_1,955$ | $A_1,955$ $R_0,956$ | $A_0,956$ $1$ |
|---|---|---|---|---|---|---|---|---|---|---|
| $t_{951}$ ← $R_{9,947}$ | | | | | | | | | | |
| $t_{952}$ ← $R_{9,948}$ | $A_9,948$ $R_8,949$ | $A_8,949$ $R_7,950$ | $A_7,950$ $R_6,951$ | $A_6,951$ $R_5,952$ | $A_5,952$ $R_4,953$ | $A_4,953$ $R_3,954$ | $A_3,954$ $R_2,955$ | $A_2,955$ $R_1,956$ | $A_1,956$ $R_0,957$ | $A_0,957$ $1$ |
| $t_{953}$ ← $R_{9,949}$ | $A_9,949$ $R_8,950$ | $A_8,950$ $R_7,951$ | $A_7,951$ $R_6,952$ | $A_6,952$ $R_5,953$ | $A_5,953$ $R_4,954$ | $A_4,954$ $R_3,955$ | $A_3,955$ $R_2,956$ | $A_2,956$ $R_1,957$ | $A_1,957$ $R_0,958$ | $A_0,958$ $1$ |
| $t_{954}$ ← $R_{9,950}$ | $A_9,950$ $R_8,951$ | $A_8,951$ $R_7,952$ | $A_7,952$ $R_6,953$ | $A_6,953$ $R_5,954$ | $A_5,954$ $R_4,955$ | $A_4,955$ $R_3,956$ | $A_3,956$ $R_2,957$ | $A_2,957$ $R_1,958$ | $A_1,958$ $R_0,959$ | $A_0,959$ $1$ |
| $t_{955}$ ← $R_{9,951}$ | $A_9,951$ $R_8,952$ | $A_8,952$ $R_7,953$ | $A_7,953$ $R_6,954$ | $A_6,954$ $R_5,955$ | $A_5,955$ $R_4,956$ | $A_4,956$ $R_3,957$ | $A_3,957$ $R_2,958$ | $A_2,958$ $R_1,959$ | $A_1,959$ $R_0,960$ | $A_0,960$ $1$ |
| $t_{956}$ ← $R_{9,952}$ | $A_9,952$ $R_8,953$ | $A_8,953$ $R_7,954$ | $A_7,954$ $R_6,955$ | $A_6,955$ $R_5,956$ | $A_5,956$ $R_4,957$ | $A_4,957$ $R_3,958$ | $A_3,958$ $R_2,959$ | $A_2,959$ $R_1,960$ | $A_1,960$ $R_0,961$ | $A_0,961$ $1$ |
| $t_{957}$ ← $R_{9,953}$ | $A_9,953$ $R_8,954$ | $A_8,954$ $R_7,955$ | $A_7,955$ $R_6,956$ | $A_6,956$ $R_5,957$ | $A_5,957$ $R_4,958$ | $A_4,958$ $R_3,959$ | $A_3,959$ $R_2,960$ | $A_2,960$ $R_1,961$ | $A_1,961$ $R_0,962$ | $A_0,962$ $1$ |
| $t_{958}$ ← $R_{9,954}$ | $A_9,954$ $R_8,955$ | $A_8,955$ $R_7,956$ | $A_7,956$ $R_6,957$ | $A_6,957$ $R_5,958$ | $A_5,958$ $R_4,959$ | $A_4,959$ $R_3,960$ | $A_3,960$ $R_2,961$ | $A_2,961$ $R_1,962$ | $A_1,962$ $R_0,963$ | $A_0,963$ $1$ |
| $t_{959}$ ← $R_{9,955}$ | $A_9,955$ $R_8,956$ | $A_8,956$ $R_7,957$ | $A_7,957$ $R_6,958$ | $A_6,958$ $R_5,959$ | $A_5,959$ $R_4,960$ | $A_4,960$ $R_3,961$ | $A_3,961$ $R_2,962$ | $A_2,962$ $R_1,963$ | $A_1,963$ $R_0,964$ | $A_0,964$ $1$ |
| $t_{960}$ ← $R_{9,956}$ | $A_9,956$ $R_8,957$ | $A_8,957$ $R_7,958$ | $A_7,958$ $R_6,959$ | $A_6,959$ $R_5,960$ | $A_5,960$ $R_4,961$ | $A_4,961$ $R_3,962$ | $A_3,962$ $R_2,963$ | $A_2,963$ $R_1,964$ | $A_1,964$ $R_0,965$ | $A_0,965$ $1$ |
| $t_{961}$ ← $R_{9,957}$ | $A_9,957$ $R_8,958$ | $A_8,958$ $R_7,959$ | $A_7,959$ $R_6,960$ | $A_6,960$ $R_5,961$ | $A_5,961$ $R_4,962$ | $A_4,962$ $R_3,963$ | $A_3,963$ $R_2,964$ | $A_2,964$ $R_1,965$ | $A_1,965$ $R_0,966$ | $A_0,966$ $1$ |
| $R_{9,958}$ | $A_9,958$ $R_8,959$ | $A_8,959$ $R_7,960$ | $A_7,960$ $R_6,961$ | $A_6,961$ $R_5,962$ | $A_5,962$ $R_4,963$ | $A_4,963$ $R_3,964$ | $A_3,964$ $R_2,965$ | $A_2,965$ $R_1,966$ | $A_1,966$ $R_0,967$ | $A_0,967$ $1$ |

TABLE VII (FIG. 9)

| | $t_{950}$ | $t_{951}$ | $t_{952}$ | $t_{953}$ | $t_{954}$ | $t_{955}$ | $t_{956}$ | $t_{957}$ | $t_{958}$ | $t_{959}$ | $t_{960}$ |
|---|---|---|---|---|---|---|---|---|---|---|---|
| | 1 1 | 0 1 | 1 1 | 0 1 | 1 1 | 0 1 | 1 1 | 0 1 | 1 1 | 0 1 | 0 1 |
| | 1 0 | 1 1 | 0 0 | 0 1 | 1 0 | 1 1 | 0 0 | 0 1 | 1 0 | 1 1 | |
| | 1 0 | 1 0 | 1 1 | 0 0 | 0 0 | 0 0 | 0 1 | 1 0 | 1 0 | 1 0 | |
| | 1 0 | 1 0 | 1 0 | 1 1 | 0 0 | 0 0 | 0 0 | 0 0 | 0 0 | 0 0 | |
| | 1 0 | 1 0 | 1 0 | 1 0 | 1 1 | 0 0 | 0 0 | 0 0 | 0 0 | 0 0 | |
| | 1 0 | 1 0 | 1 0 | 1 0 | 1 0 | 1 1 | 0 0 | 0 0 | 0 0 | 0 0 | |
| | 1 0 | 1 0 | 1 0 | 1 0 | 1 0 | 1 0 | 1 1 | 0 0 | 0 0 | 0 0 | |
| | 1 0 | 1 0 | 1 0 | 1 0 | 1 0 | 1 0 | 1 0 | 1 1 | 0 0 | 0 0 | |
| | 1 0 | 1 0 | 1 0 | 1 0 | 1 0 | 1 0 | 1 0 | 1 0 | 1 1 | 0 0 | |
| | 1 0 | 1 0 | 1 0 | 1 0 | 1 0 | 1 0 | 1 0 | 1 0 | 1 0 | 1 1 | 0 |

TIME DIVISION MULTIPLEX SWITCHING NETWORK WITH AN ASSOCIATIVE BUFFER STORE OF THE REGISTER COUNTER TYPE

BACKGROUND OF THE INVENTION

Field of the Invention

The present invention relates to improvements made to time-division multiplex switching networks and, more particularly, to switching networks of this type in which the buffer store is an associative type store addressable by its contents and constructed using coupled charge devices (CCD).

Description of the Prior Art

U.S. Pat. No. 3,971,892 includes a description of a time-division multiplex switching network comprising an input stage having plurality of incoming multiplex highways and a supermultiplexer converting the said incoming multiplex highways into one incoming supermultiplex highway; an output stage having outgoing supermultiplex highway and a superdemultiplexer converting the said outgoing supermultiplex highway into a plurality of outgoing multiplex highways; a buffer store having a write in input connected to the incoming supermultiplex highway and a read out output connected to the outgoing supermultiplex highway; and means for sequentially writing, in data storage locations of the buffer store, the words present in the time-slots of the incoming supermultiplex highway. The said buffer store is a circulating store addressable by its contents. The buffer store includes random address store locations associated with the said data store locations and a fixed address store giving the addresses of the component time-slots of the outgoing supermultiplex highway. Plural comparator means, each associated with a data store location, and a random address store location compare the random addresses written in the address store locations with the fixed addresses of the component time-slots of the outgoing supermultiplex highway to control read out of the word associated with a given random address when there is identity between the said given random address and a fixed address.

Assuming that there are N multiplex highways in a supermultiplex highway and 32 time-slots in each multiplex highway, the address (j–i) modulo 32N is written in the random address store location associated with the data store location containing the word in time-slot of address i in the incoming supermultiplex highway and the circulating store advances stepwise. When random address (j–i) is equal to fixed address (j–i) assigned to a given step of the circulating store, the word is read out and transferred into time-slot of address j in the outgoing supermultiplex highway.

SUMMARY OF THE INVENTION

The object of the invention is to provide a time-division multiplex switching network in which the fixed address memories included in the stages of the circulating store and the comparators associated with these fixed address memories are done eliminated.

In the prior art, the words and their associated random addresses progress unchanged in the circulating store from the input stage thereof up to the stage having a fixed address equal to the random address. In the invention, the associative buffer store is arranged as a counter and the random address which is written in the circulating store at the input stage thereof is incremented to each circulation step; the reading of the data word is ordered in the circulating store stage when the counter overflows.

BRIEF DESCRIPTION OF THE DRAWINGS

The invention will now be described in detail in relation to the accompanying drawings in which:

FIGS. 7, 8 and 9 are tables showing how the increment or decrement by one unit of the address word is performed at the rate of one bit weight per one memory step.

DESCRIPTION OF THE PREFERRED EMBODIMENTS

Figure 1:
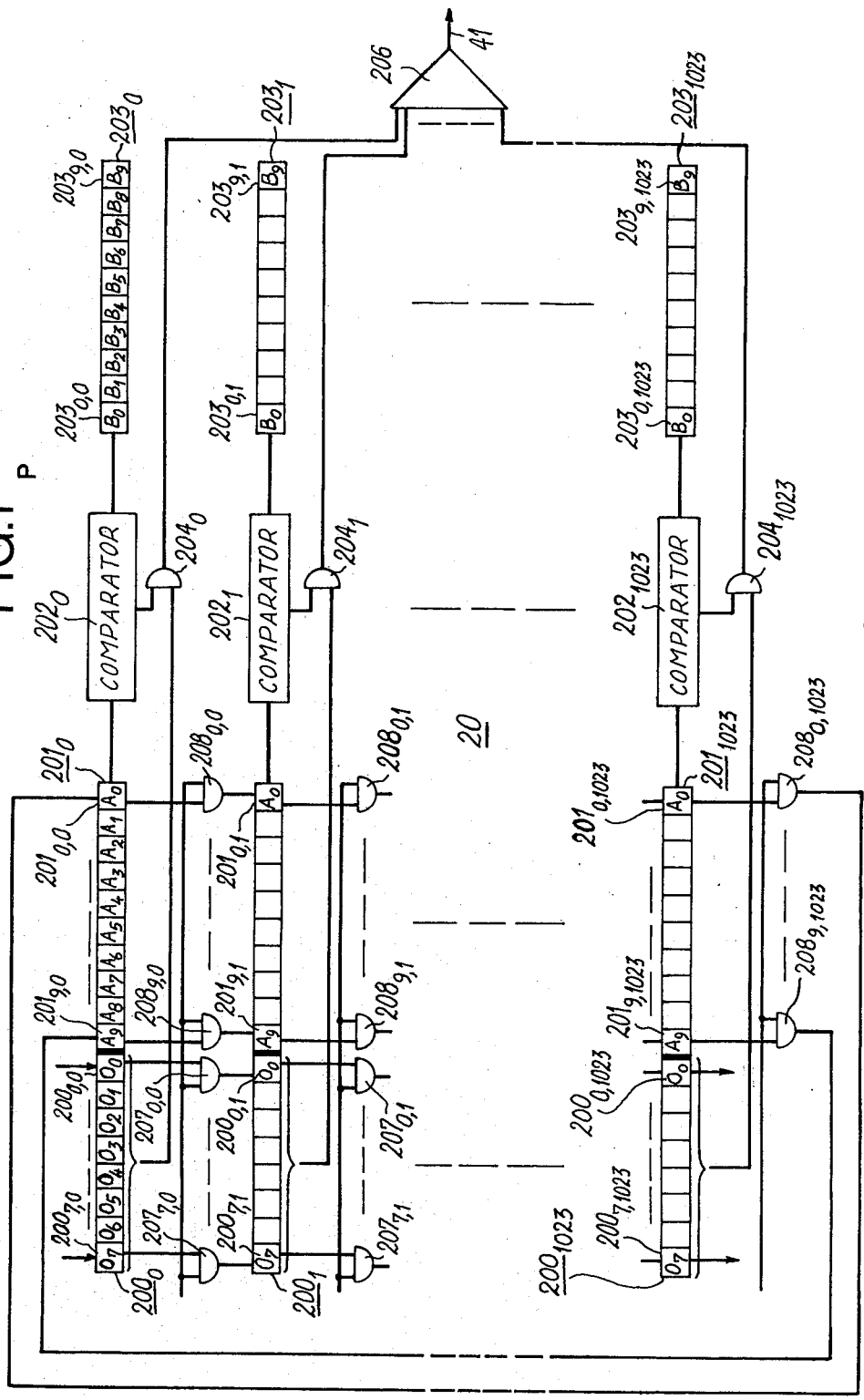
FIG. 1 is a circuit diagram of the time-division multiplex switching network described in the aforementioned patent.

Referring first to FIG. 1 which relates to the prior art, each store location of buffer store 20 comprises a data octet area $200_0$ to $200_{1023}$ respectively, a random address area $201_0$ to $201_{1023}$ respectively, a comparator $202_0$ to $202_{1023}$ respectively and a fixed address area $203_0$ to $203_{1023}$ respectively. Address areas $203_0$ to $203_{1023}$ form a read only memory, a wired memory for example. In other words, these areas unalterably contain the binary numbers 0 to 1023.

Inputs of AND gates $204_0$ to $204_{1023}$ are respectively connected to octet areas $200_0$ to $200_{1023}$ and comparators $202_0$ to $202_{1023}$; outputs of the AND gates are connected to OR-gate 206, connected to outgoing supermultiplex highway 41. The comparators each receive a fixed address coming from the read only memory.

Buffer store 20 is the circulating type. The data octet areas are eight-bit ones and the random address areas have ten bits. Consequently, there are eight unit memories $200_{0,0}$ to $200_{7,0}$ in memory area $200_0$ and the same is so in the other data octet memory areas. There are ten unit memories $201_{0,0}$ to $201_{9,0}$ in the random address memory area $201_0$ and the same is so in the other random address memory areas.

AND-gates $207_{0,0}$ to $207_{7,0}$ are connected to the outputs of unit memories $200_{0,0}$ and to $200_{7,0}$ to the inputs of unit memories $200_{0,1}$ to $200_{7,1}$ The buffer store part concerning the data octets is not looped; it receives at each frame the eight-bit words present in the time-slots of the incoming supermultiplex highway.

AND-gates $208_{0,0}$ to $208_{9,0}$ connect the outputs of unit memories $201_{0,0}$ to $201_{9,0}$ to the inputs of unit memories $201_{0,1}$ to $201_{9,1}$. Similarly AND-gates $208_{0,1023}$ to $208_{9,1023}$ connect the outputs of unit memories $201_{0,1023}$ to $201_{9,1023}$ to the inputs of unit memories $201_{0,0}$ to $201_{9,0}$.

It can thus be seen that a data octet and a random address may be written respectively in input stages $200_0$ and $201_0$ and that the octet together with the random address cyclically move around the circulating store, the octet path being non-looped and the address path being looped.

The manner in which the associative circulating store works is as follows:

Assume that time-slot of address 0 in the incoming supermultiplex highway is to be connected to time-slot of address j in the outgoing supermultiplex highway. The incoming octet is written in register $200_0$ during time interval $t_0$ and address j is written in register $201_0$ during the same time interval $t_0$. Due to the circulation, the octet, together with the address of the outgoing time-slot, progress stepwise, advancing one step per time interval. At any moment, the random address may be compared with the fixed address written in the stage of the read only memory 203 which is associated with the stage of the buffer store in which octet and random address are actually lying. In particular, at time interval $t_j$, the octet and the random address are respectively in registers $200_j$ and $201_j$ which are associated with stage $203_j$ of read only memory 203, the comparison of the random and fixed addresses is positive and the octet of address 0 is read out and transferred into time-slot of address j in the outgoing supermultiplex highway.

Now assume that time-slot of address i in the incoming supermultiplex highway is to be conncted to time-slot of address j in the outgoing supermultiplex highway. The incoming octet is then written in register $200_0$ at time interval $t_i$ and the random address (which now is merely j) is written in register $201_0$ at time interval $t_i$. At time interval $t_0$ the octet and the random address are respectively in registers $200_{(1024-i)}$ and $201_{(1024-i)}$. At time interval $t_j$, the octet and the random address are respectively in registers $200_{(1024-i+j)}$ and $201_{(1024-i+j)}$. Consequently, j is not written at time interval $t_i$ in register $201_0$; but instead $(1024-i+j)$ modulo 1024, that is $(j-i)$, is written in register $201_0$. The result of this is that if $i=0$, j is written at time interval $t_0$ in register $201_0$.

Figure 2:
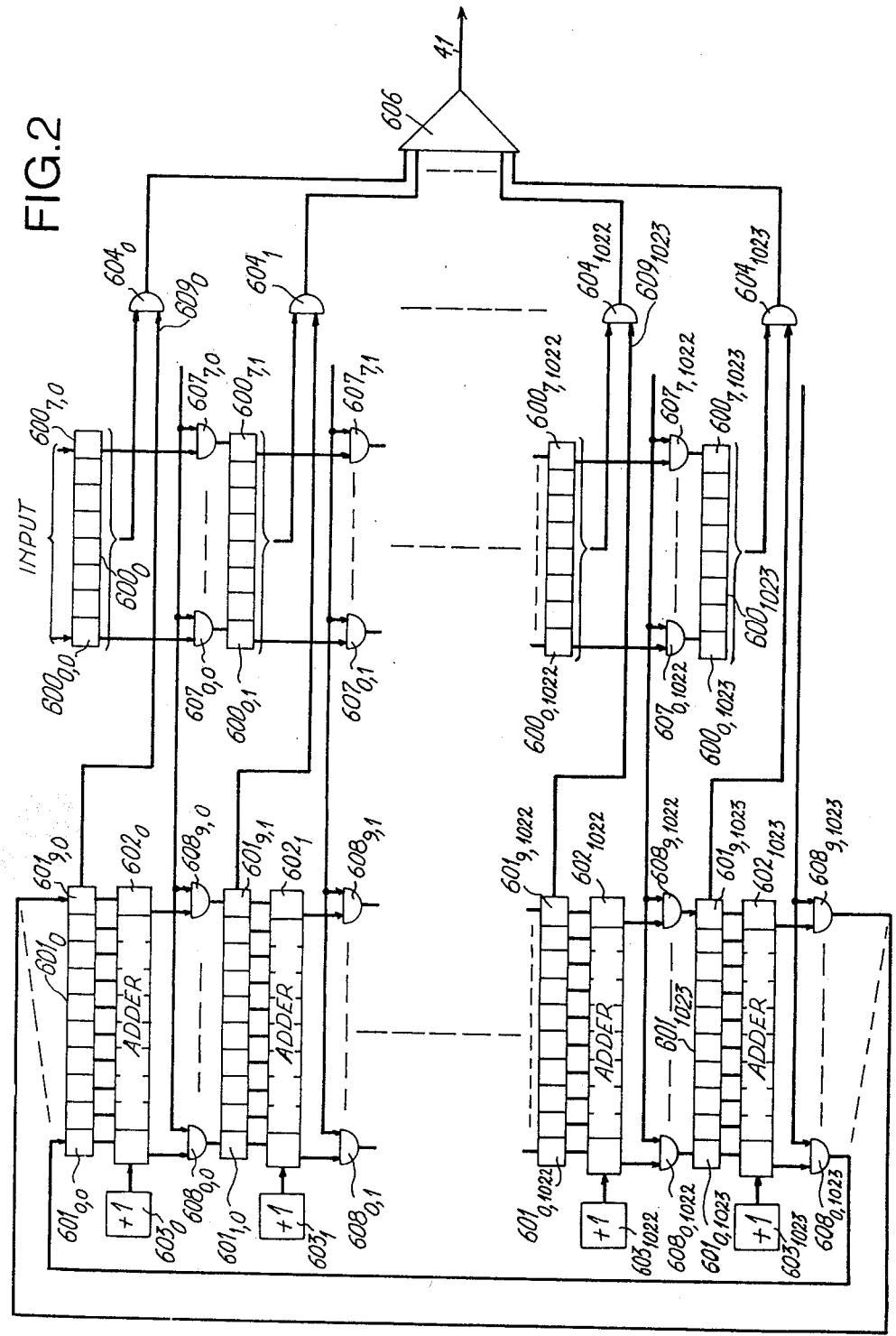
FIG. 2 is a circuit diagram of the time-division multiplex switching network in accordance with the invention.

FIG. 2 is an illustration of the associative circulating buffer store in accordance with the invention. It comprises $8 \times 1024 = 8192$ information bit-memories and $10 \times 1024 = 10240$ random address bit-memories. The information bit-memories are designated by:

$$600_{0,0} \text{ to } 600_{7,0}$$
$$\cdots\cdots\cdots\cdots$$
$$600_{0,1023} \text{ to } 600_{7,1023}.$$

The information bit memories are arranged in a circulating store in which a eight-bit data word can occupy 1024 successive word locations.

The random address bit-memories are designated by:

$$601_{0,0} \text{ to } 601_{9,0}$$
$$\cdots\cdots\cdots\cdots$$
$$601_{0,1023} \text{ to } 601_{9,1023}.$$

The random address bit memories are arranged in a circulating store in which a ten-bit address word can occupy 1024 successive word locations.

The address bit-memories are also located in counters.

As already said, while the address memory is looped from stage $601_{1023}$ ($601_{0,1023}$ to $601_{9,1023}$) to stage $601_0$ ($601_{0,0}$ to $601_{9,0}$), the data memory is not looped. Gates $$607_{0,0} \text{ to } 607_{7,0}$$
$$\cdots\cdots\cdots\cdots$$
$$607_{0,1023} \text{ to } 607_{7,1023}$$

connect the stages of the data part of the buffer store. Gates $$608_{0,0} \text{ to } 608_{9,0}$$
$$\cdots\cdots\cdots\cdots$$
$$608_{0,1023} \text{ to } 608_{9,1023}$$

connect the stages of the address part of the buffer store. Finally gates $$604_0 \text{ to } 604_{1023}$$

connect the stages of the data part of the buffer store to an OR-gate connected to the outgoing supermultiplex highway 41.

It can be seen that FIG. 2 resembles FIG. 1 to a certain extent. However, the random addresses written in the address locations when they pass from one given word location to the next. In contrast, in the FIG. 1 system the random addresses are circulated without modification and are, at each successive location, compared with fixed addresses. This incrementation is performed by means of adders $602_0$ to $602_{1023}$ and unity sources $603_0$ to $603_{1023}$. Counters $601_0$ to $601_{1023}$ overflow when they reach 1024. Assume that incoming time-slot of address i is connected to outgoing time-slot of address j, and that the incoming time-slot contains a word which is written at time interval $t_i$ in input data register $600_0$ while address $(1024-j+i)$ is written in input address register $601_0$. When this address arrives in register $601_{(j-i)}$ at time interval $t_j$, i.e. after $(j-i)$ time intervals, the address becomes $$1024-(j-i)+(j-i)=1024$$

Figure 3:
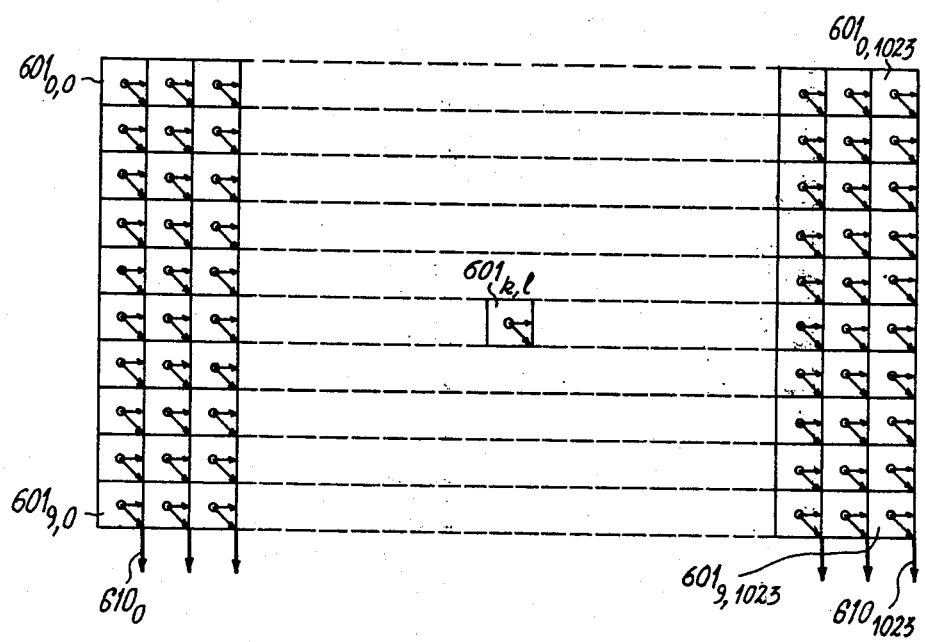
FIG. 3 is a circuit diagram of the principle of an associative buffer store with count down.

Counter $601_{(j-i)}$ overflows and operates gate $604_{(j-i)}$ via wire $609_{(j-i)}$ and the octet in circulation leaves at time interval $t_j$. Reference is now made to FIG. 3, wherein each stage of the address part of the buffer store assigned to the octet reading control comprises a plurality of cells $C_{k,l}$ with $0 \leq k \leq 9$ and $0 \leq l \leq 1023$. In FIG. 3, the horizontal arrows in cells $C_{k,l}$ represent the progression of the address words, whereas the diagonal arrows represent the progression of the carry over values. On the line of index $k=0$, the previous carry over is replaced by a binary digit 1.

Figure 4:
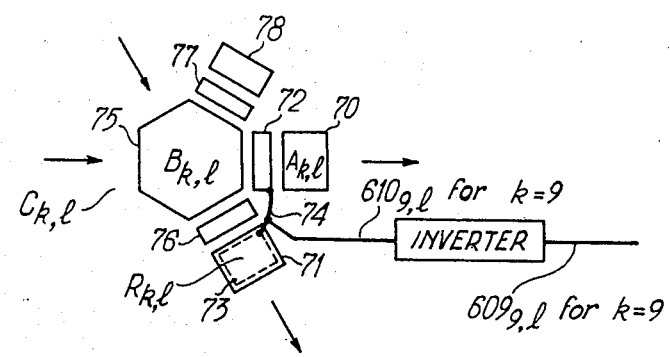

FIG. 4 is an illustration of how a cell $C_{k,l}$ is set up in a coupled charge device.

Unit memory 70 temporarily stores the address bit $A_{k,l}$ resulting from the addition which takes place in cell $C_{k,l}$. Unit memory 71 temporarily stores carry over bit $R_{k,l}$ resulting from the carry over of the addition which takes place in cell $C_{k,l}$. Control electrode 72 controls coupling of the charge of $B_{k,l}$ to $A_{k,l}$ depending on the potential of electrode 72. Equipotential link 73 connects cell 72 to change sensor 73. CCD (charge coupled device) adder 75 receives the charges due to the previous carry over $R_{(k-1),l}$ and the previous address bit $A_{k,(l-1)}$. Potential barrier 76 enables the excess of charge of cell $B_{k,l} R_{k,l}$. Finally, electrode 77 allows to be coupled to cell the contents of cell $B_{k,l}$ to be cleared after an addition operation and PN junction 78 makes it possible to absorb the previous charge if necessary.

Figure 5:
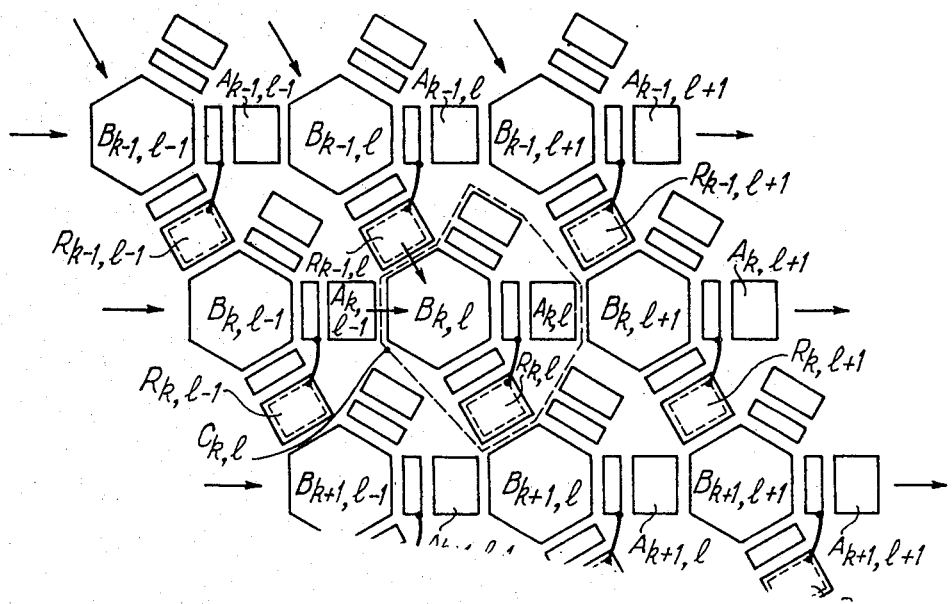

FIG. 5 is a view of an assembly of 9 cells such as that described in FIG. 4.

Cell $C_{k,l}$ operates in the following manner.

It can be seen that the address part of the circulating buffer store shown in FIG. 3 has 1024 output wires $610_0$ to $610_{1023}$ respectively connected to cells $C_{9,0}$ to $C_{9,1023}$. Each of wires $610_0$ to $610_{1023}$ is respectively connected to a wire, $609_0$ to $609_{1023}$ by means of an inverter circuit, discussed infra. Wire $609_{(j-i)}$ controls gate $604_{(j-i)}$ which allows the reading at time interval $t_j$ of the data word entered at time interval $t_i$. On each clock pulse defining a time interval, the charges representative of the logic levels derived from cells $R_{(k-1),l}$ and $A_{k,(l-1)}$ are transferred to cell $B_{k,l}$ where they are added. Potential barrier 76 allows any surplus charge to pass to cell $R_{k,l}$. (Surplus charge is coupled to cell $R_k$, the contents of cells only if $A_{k,(l-1)}$ and $R(k-1),l$ are both binary one values. The contents of cell $R_{k,l}$ consequently represents the carry over of the addition. Next solely the absence of charges in cell $R_{k,l}$ makes for the transfer of the contents of cell $B_{k,l}$ into cell $A_{k,l}$; it thus follows that the result of the addition is to be found in $A_{k,l}$.

A final clock pulse on the electrode 77, FIG. 4, enables the binary signal of cell $B_{k,l}$ to be set back to zero.

Tables I to IV herebelow summarize the possible cases.

TABLE I

The initial situation is $A_{k,(l-1)} = 0$; $R_{(k-1),l} = 0$

|          | $A_{k,(l-1)}$ | $R_{(k-1),l}$ | $B_{k,l}$ | $R_{k,l}$ | $A_{k,l}$ |
|----------|---------------|---------------|-----------|-----------|-----------|
| 1st time | 0             | 0             | 0         | 0         | 0         |
| 2nd time | 0             | 0             | 0         | 0         | 0         |
| 3rd time | 0             | 0             | 0         | 0         | 0         |
| 4th time | 0             | 0             | 0         | 0         | 0         |

TABLE II

The initial situation is $A_{k,(l-1)} = 0$; $R_{(k-1),l} = 0$

|          | $A_{k,(l-1)}$ | $R_{(k-1),l}$ | $B_{k,l}$ | $R_{k,l}$ | $A_{k,l}$ |
|----------|---------------|---------------|-----------|-----------|-----------|
| 1st time | 0             | 0             | 1         | 0         | 0         |
| 2nd time | 0             | 0             | 1         | 0         | 0         |
| 3rd time | 0             | 0             | 0         | 0         | 1         |
| 4th time | 0             | 0             | 0         | 0         | 1         |

TABLE III

The initial situation is $A_{k,(l-1)} = 1$; $R_{(k-1),l} = 0$

|          | $A_{k,(l-1)}$ | $R_{(k-1),l}$ | $B_{k,l}$ | $R_{k,l}$ | $A_{k,l}$ |
|----------|---------------|---------------|-----------|-----------|-----------|
| 1st time | 0             | 0             | 1         | 0         | 0         |
| 2nd time | 0             | 0             | 1         | 0         | 0         |
| 3rd time | 0             | 0             | 0         | 0         | 0         |
| 4th time | 0             | 0             | 0         | 0         | 0         |

TABLE IV

The initial situation is $A_{k,(l-1)} = 1$; $R_{(k-1),l} = 1$

|          | $A_{k,(l-1)}$ | $R_{(k-1),l}$ | $B_{k,l}$ | $R_{k,l}$ | $A_{k,l}$ |
|----------|---------------|---------------|-----------|-----------|-----------|
| 1st time | 0             | 0             | 1+1       | 0         | 0         |
| 2nd time | 0             | 0             | 1         | 1         | 0         |
| 3rd time | 0             | 0             | 1         | 1         | 0         |
| 4th time | 0             | 0             | 0         | 1         | 0         |

Figure 6:
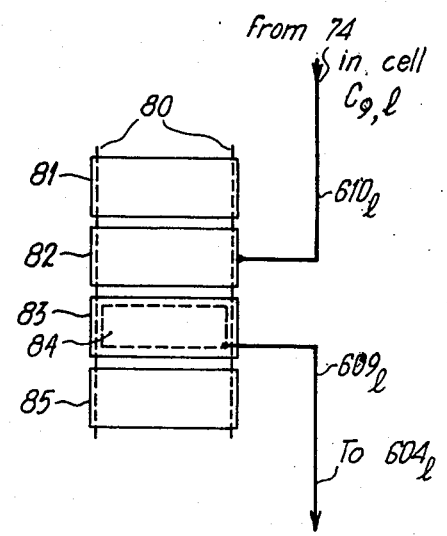
FIGS. 4, 5 and 6 are circuit diagrams of that part of the associative buffer store; and which serves as a control store.

The reading of the data octet from one of the octet registers is controlled by the carry over in cell $C_{9,l}$. With this in mind, the potential derived in charge sensor 73 in FIG. 4 must be considered. However, this potential allows the octet to be read only when the value of the charge packet representative of the carry over is zero; the sign should thus be inverted. Sensor 73 is therefore connected to an inverter-regenerator, a device quite familiar to those of ordinary skill in the charge coupled device field. Such an inverter is shown in FIG. 6, wherein isolating diffused part 80 localizes the charges in the cell. PN junction 81 is biased to generate charges. 82 is an electrode connected to charge sensor 73 of cell $C_{9,l}$. Clock electrode 83 controls the progression of the charges. Charge sensor 84 is connected to the output gate $604_l$ of the octet register $600_l$. Finally non-biased PN junction 85 absorbs the charges.

Thus reading of the octet is controlled by control charge sensor 84.

The manner in which the address part of the buffer store works is described from the following example.

Assume that incoming time-slot of address $i=3$ in the incoming supermultiplex highway is to be connected to outgoing time-slot of address $j=960$ in the outgoing supermultiplex highway. At time interval $t_3$, the octet of address $i=3$ is written in register $600_0$ and, at time interval $t_{960}$, i.e. 957 clock pulses later, it is to be read from register $600_{957}$. An address or control word is written at time interval $t_3$ in address register $601_0$. The address word reaches the value 1024 after it has circulated around to register $600_{957}$; this address word is normally $$1024 - (j-i) = 67 = 0\ 0\ 0\ 1\ 0\ 0\ 0\ 0\ 1\ 1$$

The foregoing reasoning assumes that, at each stage of the circulating store, a complete addition (including the propagation of the carry-overs) of unitary and the address word in the address register of this stage takes place.

In this system of complete addition at each stage, the operation of the address part of the buffer store can be summarized by the following table:

|               | time-slot | number of address register | address word              |
|---------------|-----------|----------------------------|---------------------------|
|               | $t_0$     | $601_{1021}$               | $64 = 0\ 0\ 0\ 1\ 0\ 0\ 0\ 0\ 0\ 0$ |
|               | $t_1$     | $601_{1022}$               | $65 = 0\ 0\ 0\ 1\ 0\ 0\ 0\ 0\ 0\ 1$ |
|               | $t_2$     | $601_{1023}$               | $66 = 0\ 0\ 0\ 1\ 0\ 0\ 0\ 0\ 1\ 0$ |
| writing-in    | $t_3$     | $601_0$                    | $67 = 0\ 0\ 0\ 1\ 0\ 0\ 0\ 0\ 1\ 1$ |
| ...           |           |                            |                           |
|               | $t_{951}$ | $601_{948}$                | $1015 = 1\ 1\ 1\ 1\ 1\ 1\ 0\ 1\ 1\ 1$ |
|               | $t_{959}$ | $601_{956}$                | $1023 = 1\ 1\ 1\ 1\ 1\ 1\ 1\ 1\ 1\ 1$ |
| reading-out   | $t_{960}$ | $601_{957}$                | $1024 = 1\ 0\ 0\ 0\ 0\ 0\ 0\ 0\ 0\ 0\ 0$ |
| ...           |           |                            |                           |
|               | $t_{1023}$| $601_{1020}$               | $63 = 0\ 0\ 0\ 0\ 1\ 1\ 1\ 1\ 1\ 1$ |

In keeping with another characteristic of the invention, the addition of unity to the address when the address passes from one stage of the buffer store to the following stage is distributed over a number of stages equal to the number of bits in the number where the counters overflow; thus the addition is not performed once at each stage.

Under these conditions and supposing that the number for which the counters overflow has eleven bits, the addition of $+1$ to the address occurs in ten clock pulses by initially adding $+1$ to the address bit of binary weight 0; then during the following time interval the carry from this first addition is added to the address bit of binary weight 1, then during the following time interval the carry over of this second addition is added to the address bit of binary weight 2, and so forth.

Table V hereinbelow represents a portion of the address part of the buffer store contained in the register and counter. In each box of TABLE V, there are two unit memories $A_{k,(l-1)}$ and $R_{(k-1),l}$. Each box of a horizontal line corresponds to a bit of an address word. Each box of a column corresponds to one of the 1024 positions of the address part of the buffer store. The following sketch represents the locations in Table V of the added bits (1) $A_{k,(l-1)} + R_{(k-1),l} \longrightarrow A_{k,l}$ and $R_{k,l}$ (carry over)

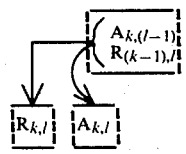

Table V therefore represents the following additions:

$A_{0,956} + 1 \longrightarrow A_{0,957}$ and $R_{0,957}$ $A_{1,955} + R_{0,956} \longrightarrow A_{1,956}$ and $R_{1,956}$ $A_{2,954} + R_{1,955} \longrightarrow A_{2,955}$ and $R_{2,955}$

. . . . . . . . . . . . . . . . . . . . . . . . . . . . . .

$A_{4,956} + R_{3,957} \longrightarrow A_{4,957}$ and $R_{4,957}$

These additions are represented in Table V of FIG. 7 by brackets connecting the two digits to be added and a vertical arrow to the resulting sum and a diagonal arrow to the carry over. These operations occur at each interval of time; 10240 elementary operations of the type indicated in Equation (1) therefore take place during each interval of time.

Coming back to the above example at time $t_3$, the address word lies at stage 0 (stage $601_0$); the same is true of the data octet (stage $600_0$). The address progresses through the address register and counter by undergoing successive additions.

Closer consideration of the staggered addition process corresponding to position or stage 957 reveals that this position corresponds to the output of the data octet at time $t_{960}$ since the octet was entered in $t_3$.

Table VI is a repeat of Table V with the addition of the time references corresponding to this particular case.

In $T_{952}$, on one line appears:

| | | |
|---|---|---|
| $A_{0,957} + 1$ | $\rightarrow$ | $A_{0,958}$ and $R_{0,958}$ |
| $A_{1,956} + R_{0,957}$ | $\rightarrow$ | $A_{1,957}$ and $R_{1,957}$ |
| $A_{2,955} + R_{1,956}$ | $\rightarrow$ | $A_{2,955}$ and $R_{2,956}$ |
| $A_{3,953} + R_{2,955}$ | $\rightarrow$ | $A_{3,955}$ and $R_{3,955}$ |
| $A_{4,953} + R_{3,954}$ | $\rightarrow$ | $A_{4,954}$ and $R_{4,954}$ |
| $A_{5,952} + R_{4,953}$ | $\rightarrow$ | $A_{5,953}$ and $R_{5,953}$ |
| $A_{6,951} + R_{5,952}$ | $\rightarrow$ | $A_{6,952}$ and $R_{6,952}$ |
| $A_{7,950} + R_{6,951}$ | $\rightarrow$ | $A_{7,951}$ and $R_{7,951}$ |
| $A_{8,949} + R_{7,950}$ | $\rightarrow$ | $A_{8,950}$ and $R_{8,950}$ |
| $A_{9,948} + R_{8,949}$ | $\rightarrow$ | $A_{9,949}$ and $R_{9,949}$ |

These ten elementary operations correspond to the control word at time $t_{952}$.

The calculation follows through $t_{953}, t_{854} \ldots$ etc. Consider the series leading up to the complete addition corresponding to a determined number in ten steps:

At $t_{951}$, we have in particular $A_{0,956} + 1 \longrightarrow A_{0,957}$ and $R_{0,957}$ At $t_{952}$, we have $A_{1,956} + R_{0,957} \longrightarrow A_{1,957}$ and $R_{1,957}$ At $t_{953}$, we have $A_{2,956} + R_{1,957} \longrightarrow A_{2,957}$ and $R_{2,957}$ At $t_{954}$, we have $A_{3,956} + R_{2,957} \longrightarrow A_{3,957}$ and $R_{3,957}$ At $t_{955}$, we have $A_{4,956} + R_{3,957} \longrightarrow A_{4,967}$ and $R_{4,957}$ At $t_{956}$, we have $A_{5,956} + R_{4,957} \longrightarrow A_{5,957}$ and $R_{5,957}$ At $t_{957}$, we have $A_{6,956} + R_{5,957} \longrightarrow A_{6,957}$ and $R_{6,957}$ At $t_{958}$, we have $A_{7,956} + R_{6,957} \longrightarrow A_{7,957}$ and $R_{7,957}$ At $t_{959}$, we have $A_{8,956} + R_{7,957} \longrightarrow A_{8,957}$ and $R_{8,957}$ At $t_{960}$, we have $A_{9,956} + R_{8,957} \longrightarrow A_{9,957}$ and $R_{9,957}$ The last carry over $R_{9,957}$ is the one which causes the reading of the data octet at time $t_{960}$.

Table VII resumes the digital example of connecting incoming time-slot 3 to outgoing time-slot 960. In this table, each line represents an address word with its carry overs as before; however in this case, the table indicates the development of the address word in time by leaving the other address words out of consideration.

The first line of Table VII represents the address word at time $t_{950+\epsilon}$; in the second line of the Table representing $t_{951+\epsilon}$, the same word has advanced by one open line, etc.

In Table VII, the addition process can be followed on the digital example. In particular, the diagonal indicated by the closed loops represents the propagation of the addition in ten clock pulses terminating in overflowing of the counter at the value of 1024.

At time $t_3$, an address other than 67 must be initialized. The initialized address results from the following analysis:

If it is assumed that the writing of an address in the address part of the buffer store occurs at time $t_3$ as specified hereinabove, only the most significant bit is exact at that moment. The previous bit had a correct value at position 1023. At position 0, the value of the previous bit must be deducted from the value

```
67 + 1 = 0001000100 in binary
              ↑
         Its value is thus 0
```

The previous bit had a correct value at position 1022. At position 0, it must therefore be deducted from the value

```
67 + 2 = 0001000101 in binary
              ↑
         Its value is thus 0
```

And so forth.

The following table indicates the value of the bits which are written in register $601_0$ instead of 67.

| weight of the bits | 9876543210 | |
|---|---|---|
| weight 9 | 0001000011<br>↑ | 67 |
| weight 8 | 0001000100<br>↑ | 67 + 1 |
| weight 7 | 0001000101<br>↑ | 67 + 2 |
| weight 6 | 0001000110<br>↑ | 67 + 3 |
| weight 5 | 0001000111<br>↑ | 67 + 4 |
| weight 4 | 0001001000<br>↑ | 67 + 5 |
| weight 3 | 0001001001<br>↑ | 67 + 6 |
| weight 2 | 0001001010<br>↑↓ | 67 + 7 |
| weight 1 | 0001001011<br>↑ | 67 + 8 |
| weight 0 | 0001001100<br>↑ | 67 + 9 |

The value to be written in position 0 (stage $601_0$) is therefore (without taking the remainders into account) 0001001010 (indicated by the arrows pointing upward)

More generally speaking, let i still be the incoming time-slot to be connected to outgoing time-slot j. Put $j-i=a$ (mod. 1024).

Let "." represent the logic "AND" operation, "+" the logic "OR" operation and "plus" the arithmetic "binary addition" operation.

To connect time-slot i and j, the following word is written at the input of the address store at time t:

$$[\ (a.2^8)\ .\ \overline{(a\ \text{plus}\ 1.2^8)}$$
$$+\ (a\ \text{plus}\ 1.2^7)\ .\ \overline{(a\ \text{plus}\ 2.2^7)}$$
$$+\ (a\ \text{plus}\ 2.2^6)\ .\ \overline{(a\ \text{plus}\ 3.2^6)}$$
$$+\ (a\ \text{plus}\ 3.2^5)\ .\ \overline{(a\ \text{plus}\ 4.2^5)}$$
$$+\ (a\ \text{plus}\ 4.2^4)\ .\ \overline{(a\ \text{plus}\ 5.2^4)}$$
$$+\ (a\ \text{plus}\ 5.2^3)\ .\ \overline{(a\ \text{plus}\ 6.2^3)}$$
$$+\ (a\ \text{plus}\ 6.2^2)\ .\ \overline{(a\ \text{plus}\ 7.2^2)}$$
$$+\ (a\ \text{plus}\ 7.2^1)\ .\ \overline{(a\ \text{plus}\ 8.2^1)}$$
$$+\ (a\ \text{plus}\ 8.2^0)\ .\ \overline{(a\ \text{plus}\ 9.2^0)}$$
$$+\ \quad 2^{-1} \quad\quad ] \times 2^1$$

The remainders to be initialized take the following values:

$$[\ (a.2^8)\ .\ \overline{(a\ \text{plus}\ 1.2^8)}$$
$$+\ (a\ \text{plus}\ 1.2^7)\ .\ \overline{(a\ \text{plus}\ 2.2^7)}$$
$$+\ (a\ \text{plus}\ 2.2^6)\ .\ \overline{(a\ \text{plus}\ 3.2^6)}$$
$$+\ (a\ \text{plus}\ 3.2^5)\ .\ \overline{(a\ \text{plus}\ 4.2^5)}$$
$$+\ (a\ \text{plus}\ 4.2^4)\ .\ \overline{(a\ \text{plus}\ 5.2^4)}$$
$$+\ (a\ \text{plus}\ 5.2^3)\ .\ \overline{(a\ \text{plus}\ 6.2^3)}$$
$$+\ (a\ \text{plus}\ 6.2^2)\ .\ \overline{(a\ \text{plus}\ 7.2^2)}$$
$$+\ (a\ \text{plus}\ 7.2^1)\ .\ \overline{(a\ \text{plus}\ 8.2^1)}$$
$$+\ (a\ \text{plus}\ 8.2^0)\ .\ \overline{(a\ \text{plus}\ 9.2^0)}$$
$$+\ \quad 2^{-1} \quad\quad ] \times 2^1$$

What we claim is:

1. A time division multiplex switching network comprising:

in an input stage, a plurality of incoming multiplex highways and a supermultiplexer converting the said incoming multiplex highways into one incoming supermultiplex highway;

in an output stage, an out-going supermultiplex highway and a superdemultiplexer converting the said out-going supermultiplex highway into a plurality of out-going multiplex highways;

a circulating buffer store addressable by its content and comprising an input data word register and further data word registers forming a data word partial circulating store and an input random address register and further random address registers forming a random address partial circulating store, said data word partial circulating store and said random address partial circulating store operating synchronously and having associated data word registers and random address registers;

means for successively writing in the input data word register the words present in the incoming time-slots of the incoming supermultiplex highway;

means for successively writing in the input random address register addresses depending on the outgoing time slots to be connected to the incoming time slots;

means for steppedly incrementing by 1 the addresses written in the input random address register each time said addresses pass from a random address register to the next of the random address partial circulating store, and means for reading out the word stored in a data word register associated with a random address register when the incremented address stored therein has reached a predetermined value 2. A time division multiplex switching network as set forth in claim 1, in which the means for steppedly incrementing by 1 the addresses written in the input random address register consists in a unit addend register forming a counter with said random address register, said counter overflowing for a predetermined value and said reading means are operated when the incremented address has reached said counter overflowing value 3. A time division multiplex switching network as set forth in claim 1 in which the random addresses have k bits and the means for steppedly incrementing by 1 the addresses written in the input random address register are distributed addition means synchronous with the circulating buffer store successively adding 1 to the bit of binary weight 0 in a first addition, adding the carry over of said first addition to the bit of binary weight 1, in a second addition, adding the carry over of the $(k-1)$th addition to the bit of binary weight $(k-1)$ in a $(k-1)$th addition, the carry over of said $(k-1)$th addition controlling said reading out means.

* * * * *